United States Patent
Fujimori et al.

(10) Patent No.: US 9,553,239 B2
(45) Date of Patent: Jan. 24, 2017

(54) LIGHT EMITTING DEVICE AND LIGHT EMITTING DEVICE PACKAGE

(71) Applicant: ROHM CO., LTD., Kyoto (JP)

(72) Inventors: Takao Fujimori, Kyoto (JP); Nobuaki Matsui, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 48 days.

(21) Appl. No.: 14/173,408

(22) Filed: Feb. 5, 2014

(65) Prior Publication Data

US 2014/0239340 A1 Aug. 28, 2014

(30) Foreign Application Priority Data

Feb. 25, 2013 (JP) ................. 2013-035049

(51) Int. Cl.
| | |
|---|---|
| H01L 33/40 | (2010.01) |
| H01L 33/00 | (2010.01) |
| H01L 33/32 | (2010.01) |

(52) U.S. Cl.
CPC ........... *H01L 33/40* (2013.01); *H01L 33/0095* (2013.01); *H01L 33/32* (2013.01); *H01L 33/405* (2013.01);
(Continued)

(58) Field of Classification Search
CPC .... H01L 33/145; H01L 33/38; H01L 33/0095; H01L 33/405; H01L 33/40; H01L 33/32; H01L 2224/05644; H01L 2224/49107; H01L 2224/73265
(Continued)

(56) References Cited

U.S. PATENT DOCUMENTS

| | | | |
|---|---|---|---|
| 5,294,211 A | 3/1994 | Niimura | |
| 6,060,334 A * | 5/2000 | Tsuruma | G02F 1/035 385/129 |

(Continued)

FOREIGN PATENT DOCUMENTS

| | | |
|---|---|---|
| JP | 5-125708 A | 5/1993 |
| JP | 2005-354040 A | 12/2005 |

(Continued)

OTHER PUBLICATIONS

English translation of WO 2012/042713 (Totani et al.); Apr. 5, 2012.*

*Primary Examiner* — Kenneth Parker
*Assistant Examiner* — Bo Fan
(74) *Attorney, Agent, or Firm* — Rabin & Berdo, P.C.

(57) ABSTRACT

A light emitting device includes a first conductive-type semiconductor layer laminated on a substrate; a light emitting layer laminated on the first conductive-type semiconductor layer; a second conductive-type semiconductor layer laminated on the light emitting layer; a first ITO layer laminated at a side of the first conductive-type semiconductor layer opposite to the substrate; a second ITO layer laminated at a side of the second conductive-type semiconductor layer opposite to the substrate; a first metal layer laminated on the first ITO layer; and a second metal layer laminated on the second ITO layer. The first and second metal layers have the same structure and each includes a lower metal layer which contacts a corresponding ITO layer of the first ITO layer and the second ITO layer; and an upper metal layer laminated on the lower metal layer, the upper metal layer being thicker than the lower metal layer.

8 Claims, 9 Drawing Sheets

(52) U.S. Cl.
CPC ............... *H01L 2224/05644* (2013.01); *H01L 2224/48091* (2013.01); *H01L 2224/49107* (2013.01); *H01L 2224/73265* (2013.01)

(58) Field of Classification Search
USPC .............................. 257/76, 79; 438/29, 604
See application file for complete search history.

(56) References Cited

U.S. PATENT DOCUMENTS

| | | | |
|---|---|---|---|
| 1,001,802 A1 | 1/2011 | Okabe et al. | |
| 2006/0012000 A1* | 1/2006 | Estes | B82Y 10/00 257/425 |
| 2006/0073692 A1* | 4/2006 | Yoshida | H01L 24/03 438/605 |
| 2007/0080353 A1* | 4/2007 | Lee | H01L 33/38 257/79 |
| 2008/0224168 A1 | 9/2008 | Lee et al. | |
| 2008/0258166 A1 | 10/2008 | Sakai et al. | |
| 2008/0315176 A1* | 12/2008 | Takeuchi | H01L 33/02 257/13 |
| 2010/0072508 A1* | 3/2010 | Kamiya | H01L 33/145 257/99 |
| 2010/0133579 A1 | 6/2010 | Kim et al. | |
| 2010/0163886 A1 | 7/2010 | Fukunaga et al. | |
| 2011/0084305 A1 | 4/2011 | Lee et al. | |
| 2012/0206731 A1* | 8/2012 | Sano | G01J 3/26 356/450 |
| 2012/0248490 A1 | 10/2012 | Weng et al. | |
| 2012/0315718 A1 | 12/2012 | Tanimoto et al. | |
| 2013/0203194 A1* | 8/2013 | Totani | H01L 33/44 438/29 |
| 2013/0214320 A1 | 8/2013 | Onishi et al. | |
| 2015/0129924 A1 | 5/2015 | Onishi et al. | |

FOREIGN PATENT DOCUMENTS

| | | |
|---|---|---|
| JP | 2006-108164 A | 4/2006 |
| JP | 2007-103951 A | 4/2007 |
| JP | 2007-258445 A | 10/2007 |
| JP | 2008-227018 A | 9/2008 |
| JP | 4411871 B2 | 2/2010 |
| JP | 2010-080542 A | 4/2010 |
| JP | 2011-151086 A | 8/2011 |
| JP | 2012-094812 A | 5/2012 |
| JP | 2012-510724 A | 5/2012 |
| JP | 2012-131332 A | 7/2012 |
| JP | 2012-216771 A | 11/2012 |
| JP | 2013-171982 A | 9/2013 |
| WO | WO-2009-113659 A1 | 9/2009 |
| WO | WO 2012042713 A1 * | 4/2012 |

* cited by examiner

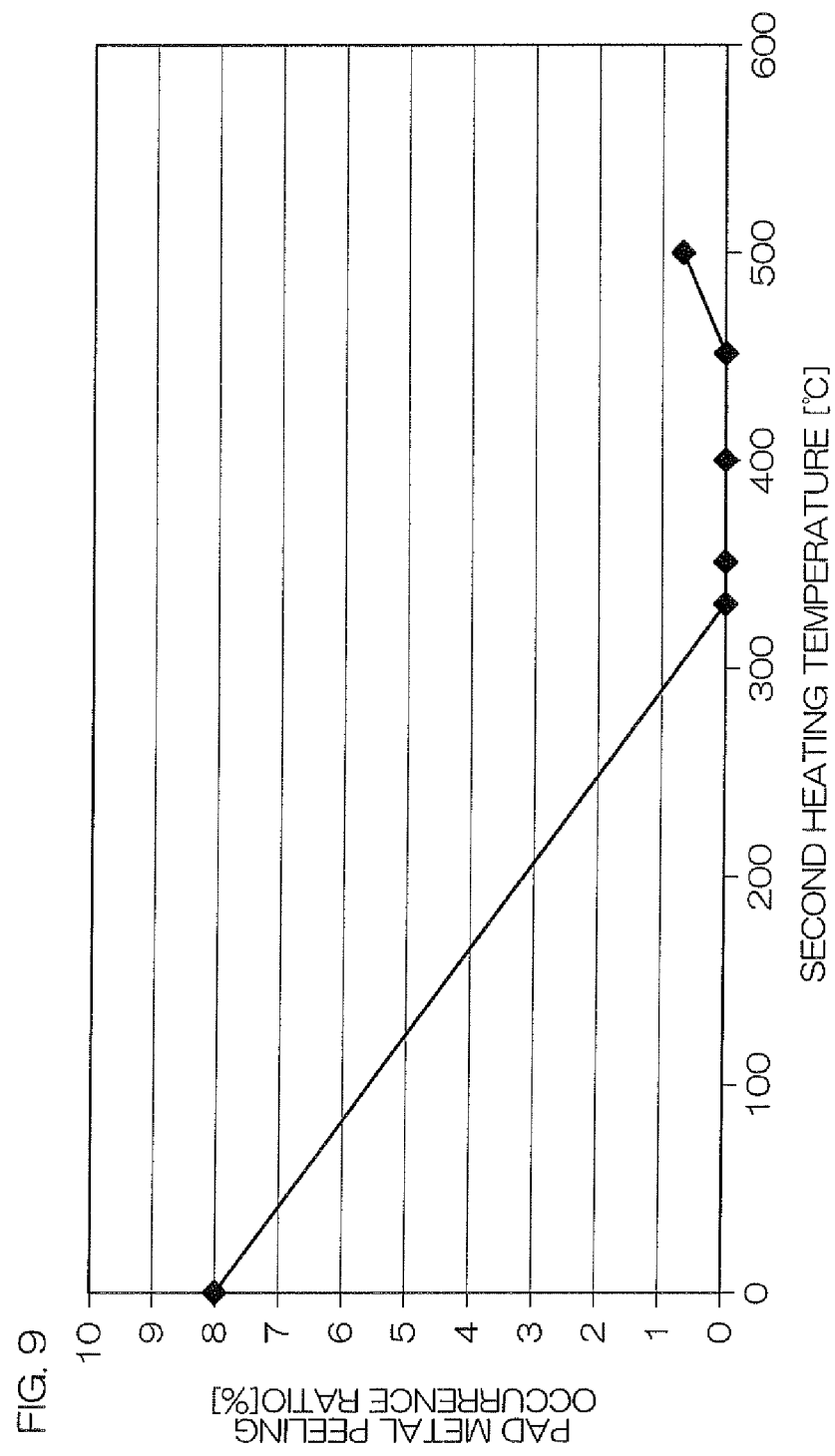

LIGHT EMITTING DEVICE AND LIGHT EMITTING DEVICE PACKAGE

BACKGROUND OF THE INVENTION

1. Field of the Invention

The present invention relates to a light emitting device, a light emitting device package including the light emitting device, and a method for manufacturing the light emitting device.

2. Description of Related Art

A semiconductor light emitting device according to one prior art is disclosed in Japanese Unexamined Patent Publication No. 2005-354040. In the semiconductor light emitting device, a low-temperature buffer layer, a high-temperature buffer layer, an n-type layer, a superlattice layer, an active layer, a p-type layer and a transparent conductive layer are laminated on a sapphire substrate in this order from the sapphire substrate side. The transparent conductive layer is made of ZnO, and a p-side electrode having a laminate structure of Ti and Au is formed on a part of the transparent conductive layer. Moreover, an n-side electrode having a laminate structure of Al, Ni and Au is formed at an exposed portion of the n-type layer.

SUMMARY OF THE INVENTION

An object of the present invention is to provide a light emitting device capable of simplifying a manufacturing process, a light emitting device package including the light emitting device, and a method for manufacturing the light emitting device.

Another object of the present invention is to provide a light emitting device capable of withstanding a manufacturing process, a light emitting device package including the light emitting device, and a method for manufacturing the light emitting device.

BRIEF DESCRIPTION OF THE DRAWINGS

FIG. 9 is a graph illustrating a relationship between a second heating temperature and strength of a light emitting device 1 (a light emitting device package 50).

DETAILED DESCRIPTION OF THE PREFERRED EMBODIMENTS

Figure 1:
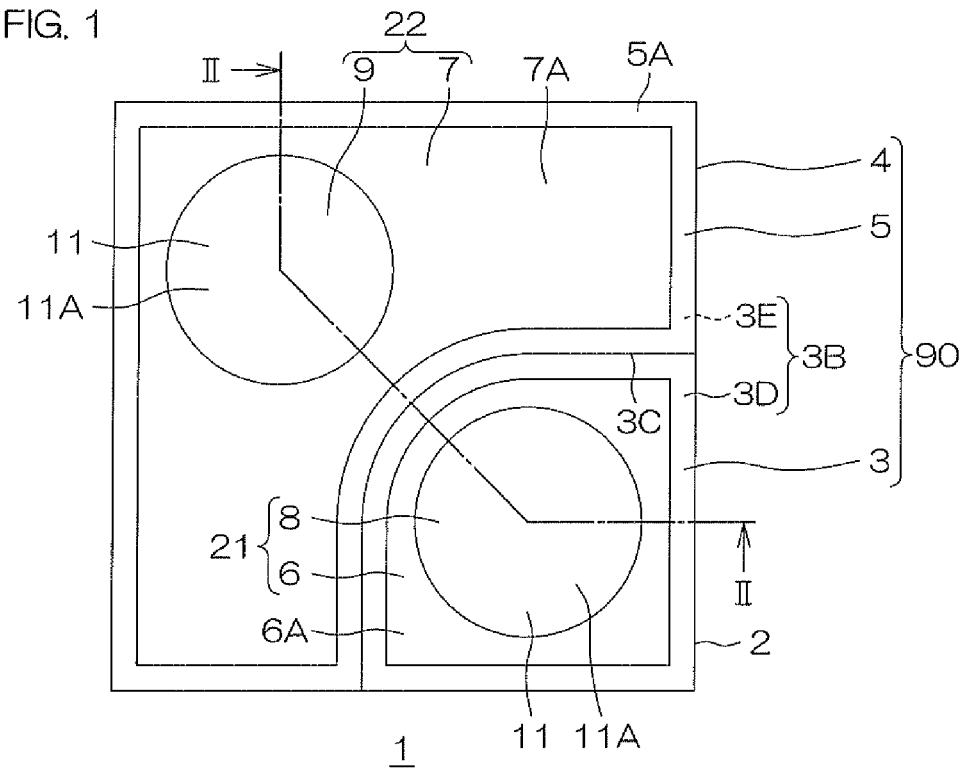
FIG. 1 is a schematic plan view of a light emitting device according to a preferred embodiment of the present invention.

A light emitting device according to a preferred embodiment of the present invention includes: a substrate; a first conductive-type semiconductor layer laminated on the substrate; a light emitting layer laminated on the first conductive-type semiconductor layer; a second conductive-type semiconductor layer laminated on the light emitting layer; a first ITO layer laminated at a side of the first conductive-type semiconductor layer opposite to the substrate; a second ITO layer laminated at a side of the second conductive-type semiconductor layer opposite to the substrate; a first metal layer laminated on the first ITO layer; and a second metal layer laminated on the second ITO layer.

With such a structure, an electrode portion of the first conductive-type semiconductor layer and an electrode portion of the second conductive-type semiconductor layer in the light emitting device have the same structure in which a metal layer is laminated on an ITO layer, and it is therefore possible to form the electrode portions simultaneously. Accordingly, it is possible to simplify a manufacturing process of a light emitting device.

For this purpose, it is preferable in a preferred embodiment of the present invention that the first ITO layer and the second ITO layer have the same thickness, and the first metal layer and the second metal layer have the same structure. The "structure (of the same structure)" means thickness, material and laminating order of the metal layer. Composition and resistance value, etc at interface (contact portion) between the metal layer and ITO layer may be different between the first metal layer and the second metal layer. According to a preferred embodiment of the present invention, it is preferable that a structure of the first metal layer at a portion near the first ITO layer is the same as a structure of the second metal layer at a portion near the second ITO layer, at least. Therefore, in a preferred embodiment of the present invention, a total structure of the first metal layer may be different from a total structure of the second metal layer because of laminating additional metal layer on either the first metal layer or the second metal layer formed by same (common) process.

Moreover, each of the first metal layer and the second metal layer in a preferred embodiment of the present invention includes: a Cr layer laminated on a corresponding ITO layer of the first ITO layer and the second ITO layer; and an Au layer laminated on the Cr layer.

With such a structure, it is possible to improve the adhesion property of an ITO layer with a metal layer at an electrode portion of each of the first conductive-type semiconductor layer and the second conductive-type semiconductor layer, and therefore it is possible to prevent a metal layer from peeling off from an ITO layer in the process of bonding a wire with the metal layer. Thus, it is possible to provide a light emitting device capable of withstanding a manufacturing process.

Moreover, it is preferable that Cr layers of the first metal layer and the second metal layer have the same thickness and Au layers of the first metal layer and the second metal layer have the same thickness, so that the first metal layer and the second metal layer have the same structure.

The first ITO layer and the second ITO layer may include Cr.

It is preferable that the first ITO layer is laminated on a region of the first conductive-type semiconductor layer other than a region where the light emitting layer is laminated.

It is possible to construct a light emitting device package including the light emitting device and a package for covering the light emitting device.

A method for manufacturing a light emitting device according to a preferred embodiment of the present invention includes the following steps of: forming a first conductive-type semiconductor layer on a substrate; forming a light emitting layer on the first conductive-type semiconductor layer; forming a second conductive-type semiconductor layer on the light emitting layer; removing a part of the light emitting layer and the second conductive-type semiconductor layer to expose the first conductive-type semiconductor layer; forming an ITO layer at a side of each of the first conductive-type semiconductor layer and the second conductive-type semiconductor layer opposite to the substrate; separating the ITO layer into a first ITO layer on the first conductive-type semiconductor layer and a second ITO layer on the second conductive-type semiconductor layer; and forming a metal layer on each of the first ITO layer and the second ITO layer.

With such a method, it is possible to form an electrode portion at the first conductive-type semiconductor layer and an electrode portion at the second conductive-type semiconductor layer simultaneously, and it is therefore possible to manufacture alight emitting device having the above structure with a simplified manufacturing process.

Moreover, a method for manufacturing a light emitting device according to a preferred embodiment of the present invention includes the following steps of: applying first heat treatment to the ITO layer with a first heating temperature after forming the ITO layer; and applying second heat treatment to the metal layer, the first ITO layer and the second ITO layer with a second heating temperature, which is lower than the first heating temperature, after forming the metal layer.

With such a method, the first heat treatment makes it possible to improve the ohmic characteristic or the adhesion property of the ITO layer with at least one of the first conductive-type semiconductor layer and the second conductive-type semiconductor layer. The subsequent second heat treatment makes it possible to improve the ohmic characteristic or the adhesion property of the ITO layer (the first ITO layer or the second ITO layer which corresponds) with at least the other of the first conductive-type semiconductor layer and the second conductive-type semiconductor layer.

It is preferable that the first heating temperature is within the range of 600° C. to 700° C., and the second heating temperature is within the range of 300° C. to 350° C.

The following description will explain a preferred embodiment of the present invention in detail with reference to the accompanying drawings.

Figure 2:
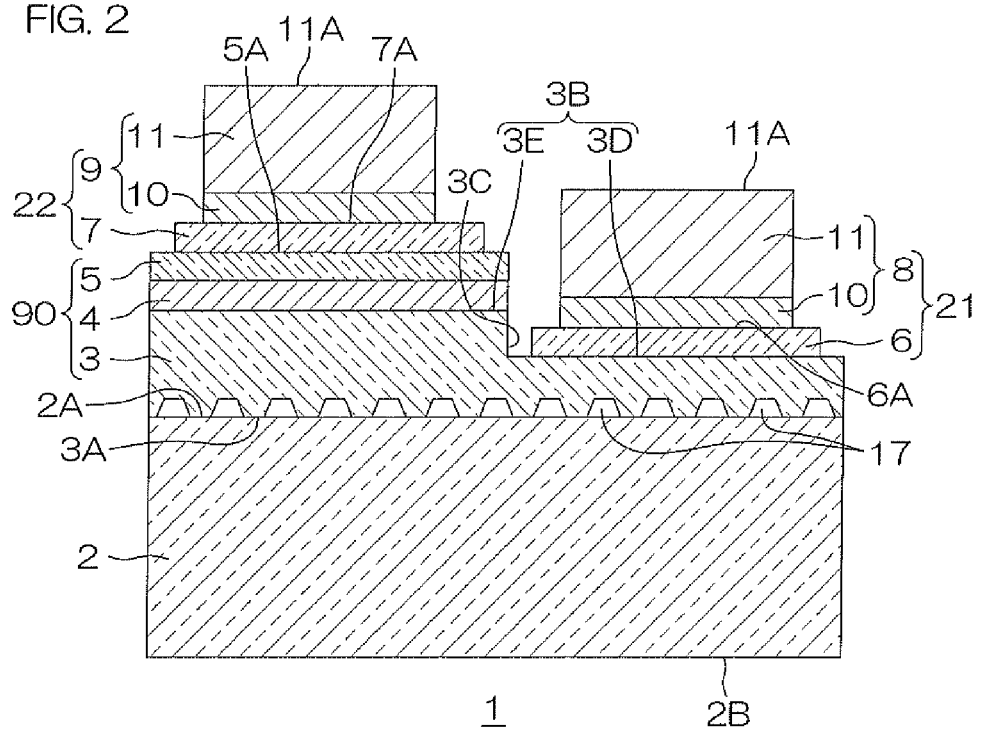
FIG. 2 is a sectional view taken along cutting line II-II in FIG. 1.

FIG. 1 is a schematic plan view of a light emitting device according to a preferred embodiment of the present invention. FIG. 2 is a sectional view taken along cutting line II-II in FIG. 1.

Referring to FIG. 2, the light emitting device 1 includes a substrate 2, a first conductive-type semiconductor layer 3, a light emitting layer 4, a second conductive-type semiconductor layer 5, a first ITO layer 6, a second ITO layer 7, a first metal layer 8 and a second metal layer 9.

The substrate 2 is made of a material (e.g., sapphire, GaN or SiC; sapphire in the present preferred embodiment) transparent to an emission wavelength (e.g., 450 nm) of the light emitting layer 4. More specifically, to be "transparent to an emission wavelength" means a case where the transmittance of an emission wavelength is equal to or higher than 60%, for example. The shape of the substrate 2 at a planar view (which will be hereinafter referred to simply as "the planar view") seen from the thickness direction (which will be hereinafter referred to simply as "the thickness direction") of the substrate 2 is a rectangular shape (substantially square shape in the present preferred embodiment) (see FIG. 1). The thickness of the substrate 2 is 100 μm, for example. Regarding the substrate 2, an upper surface in FIG. 2 is a surface 2A while a lower surface in FIG. 2 is a rear surface 2B. The surface 2A is a junction surface of the substrate 2 with the first conductive-type semiconductor layer 3. At the surface 2A, a plurality of convex portions 17 projected to the first conductive-type semiconductor layer 3 side are formed. The convex portions 17 are arranged discretely. More specifically, the convex portions 17 may be arranged in a matrix at intervals or may be arranged in a zigzag alignment at the surface 2A. Each convex portion 17 may be made of SiN.

The first conductive-type semiconductor layer 3 is laminated on the substrate 2. The first conductive-type semiconductor layer 3 covers the whole area of the surface 2A of the substrate 2. The first conductive-type semiconductor layer 3 is made of n-type GaN (n-GaN) and is transparent to an emission wavelength of the light emitting layer 4. Regarding the first conductive-type semiconductor layer 3, a lower surface covering the surface 2A of the substrate 2 in FIG. 2 will be referred to as a rear surface 3A, while an upper surface opposite to the rear surface 3A will be referred to as a surface 3B. At the surface 3B, a region at the left side in FIG. 2 is partially projected, so that a step 3C along the thickness direction is formed at the surface 3B. At the surface 3B, a region, which is at the right side of the step 3C in FIG. 2 and becomes lower toward the rear surface 3A side, will be referred to as a first region 3D, while a projected region at the left side of the step 3C in FIG. 2 will be referred to as a second region 3E. In the planar view, the first region 3D occupies approximately a quarter of the surface 3B, while the second region 3E substantially has an L shape occupying approximately three quarters of the surface 3B (see FIG. 1).

The light emitting layer 4 is laminated on the second region 3E of the first conductive-type semiconductor layer 3. The light emitting layer 4 covers the whole area of the second region 3E of the surface 3B of the first conductive-type semiconductor layer 3. Consequently, the light emitting layer 4 and the second region 3E coincide with each other in the planar view. The light emitting layer 4 is made of a nitride semiconductor (e.g., InGaN) including In.

The second conductive-type semiconductor layer 5 is laminated on the light emitting layer 4. Accordingly, the light emitting layer 4 is sandwiched by the first conductive-type semiconductor layer 3 and the second conductive-type semiconductor layer 5 in the thickness direction. The second conductive-type semiconductor layer 5 is made of p-type GaN (p-GaN) and is transparent to an emission wavelength of the light emitting layer 4. The second conductive-type semiconductor layer 5 covers the whole area of a surface (at an upper side in FIG. 2) of the light emitting layer 4 opposite to the first conductive-type semiconductor layer 3 side, and the second conductive-type semiconductor layer 5 and the light emitting layer 4 coincide with each other in the planar view. A side surface (at an upper side in FIG. 2) of the second conductive-type semiconductor layer 5 opposite to the light emitting layer 4 side will be referred to as a surface 5A.

Here, a laminate of the first conductive-type semiconductor layer 3, the light emitting layer 4 and the second conductive-type semiconductor layer 5 constructs a semiconductor laminate structure portion 90.

The first ITO layer 6 is made of ITO (tin-doped indium oxide) and is transparent to an emission wavelength of the light emitting layer 4. The thickness of the first ITO layer 6 is within the range of 1000 Å to 2000 Å, for example. The first ITO layer 6 is laminated at the first region 3D (a region of the first conductive-type semiconductor layer 3 other than the second region 3E where the light emitting layer 4 is laminated) of the surface 3B of the first conductive-type semiconductor layer 3. Since the first conductive-type semiconductor layer 3 is laminated on the substrate 2, the first ITO layer 6 is laminated at a side of the first conductive-type semiconductor layer 3 opposite to the substrate 2. The first ITO layer 6, which is formed at a region of a part of the first region 3D, does not cover the whole area of the first region 3D. More specifically, the first ITO layer 6 has a shape similar to that of the first region 3D in the planar view and is located inside the outline of the first region 3D (see also FIG. 1). A side surface (at an upper side in FIG. 2) of the first ITO layer 6 opposite to the first conductive-type semiconductor layer 3 side will be referred to as a surface 6A.

The second ITO layer 7 is made of the same material (ITO) as that of the first ITO layer 6 and has the same thickness as that of the first ITO layer 6. The second ITO layer 7 is laminated at the surface 5A of the second conductive-type semiconductor layer 5. Since the second conductive-type semiconductor layer 5 is laminated on the substrate 2 with the first conductive-type semiconductor layer 3 and the light emitting layer 4 interposed therebetween, the second ITO layer 7 is laminated at a side of the second conductive-type semiconductor layer 5 opposite to the substrate 2. The second ITO layer 7, which is formed at a region of a part of the surface 5A of the second conductive-type semiconductor layer 5, does not cover the whole area of the surface 5A. More specifically, the second ITO layer 7 has a shape similar to that of the second conductive-type semiconductor layer 5 (in other words, substantially an L shape similar to that of the second region 3E) in the planar view and is located inside the outline of the surface 5A (see also FIG. 1). A side surface (at an upper side in FIG. 2) of the second ITO layer 7 opposite to the second conductive-type semiconductor layer 5 side will be referred to as a surface 7A.

The first metal layer 8 and the second metal layer 9 are so-called pad metal. The first metal layer 8 is laminated on the first ITO layer 6 (the surface 6A of the first ITO layer 6), while the second metal layer 9 is laminated on the second ITO layer 7 (the surface 7A of the second ITO layer 7). The first metal layer 8 and the second metal layer 9 have the same structure. More specifically, each of the first metal layer 8 and the second metal layer 9 includes: a Cr layer 10 laminated on a corresponding ITO layer (the first ITO layer 6 in the case of the first metal layer 8 or the second ITO layer 7 in the case of the second metal layer 9) of the first ITO layer 6 and the second ITO layer 7; and an Au layer 11 laminated on the Cr layer 10. That is, in each of the first metal layer 8 and the second metal layer 9, the Cr layer 10 is in contact with a corresponding ITO layer.

Each Cr layer 10 is made of Cr (chromium). Each Au layer 11 is made of Au (gold). The Cr layers 10 of the first metal layer 8 and the second metal layer 9 have the same thickness and the Au layers 11 of the first metal layer 8 and the second metal layer 9 have the same thickness. In the present preferred embodiment in which the Cr layers 10 have a thickness of 300 Å, for example, and the Au layers 11 have a relatively large thickness of 2 μm, for example, Cr in the Cr layers 10 is prevented from moving to the surface of the Au layers 11.

In the planar view, the first metal layer 8 exists inside the outline of the first ITO layer 6, while the second metal layer 9 exists inside the outline of the second ITO layer 7 (see also FIG. 1). Moreover, in each of the first metal layer 8 and the second metal layer 9, the Cr layer 10 and the Au layer 11 have a circular shape of sizes which coincide with each other in the planar view (see also FIG. 1).

Here, regarding the Au layer 11 of each of the first metal layer 8 and the second metal layer 9, a side surface (at an upper side in FIG. 2) opposite to the Cr layer 10 side will be referred to as a surface 11A. Moreover, the first ITO layer 6 and the second ITO layer 7 respectively in contact with the Cr layer 10 may include Cr of the Cr layer 10.

The first ITO layer 6 and the first metal layer 8 construct a first electrode 21. The second ITO layer 7 and the second metal layer 9 construct a second electrode 22. As described above, the first ITO layer 6 and the second ITO layer 7 are made of the same material and have the same thickness, and the first metal layer 8 and the second metal layer 9 have the same structure, and therefore the first electrode 21 and the second electrode 22 have the same structure.

Figure 3:
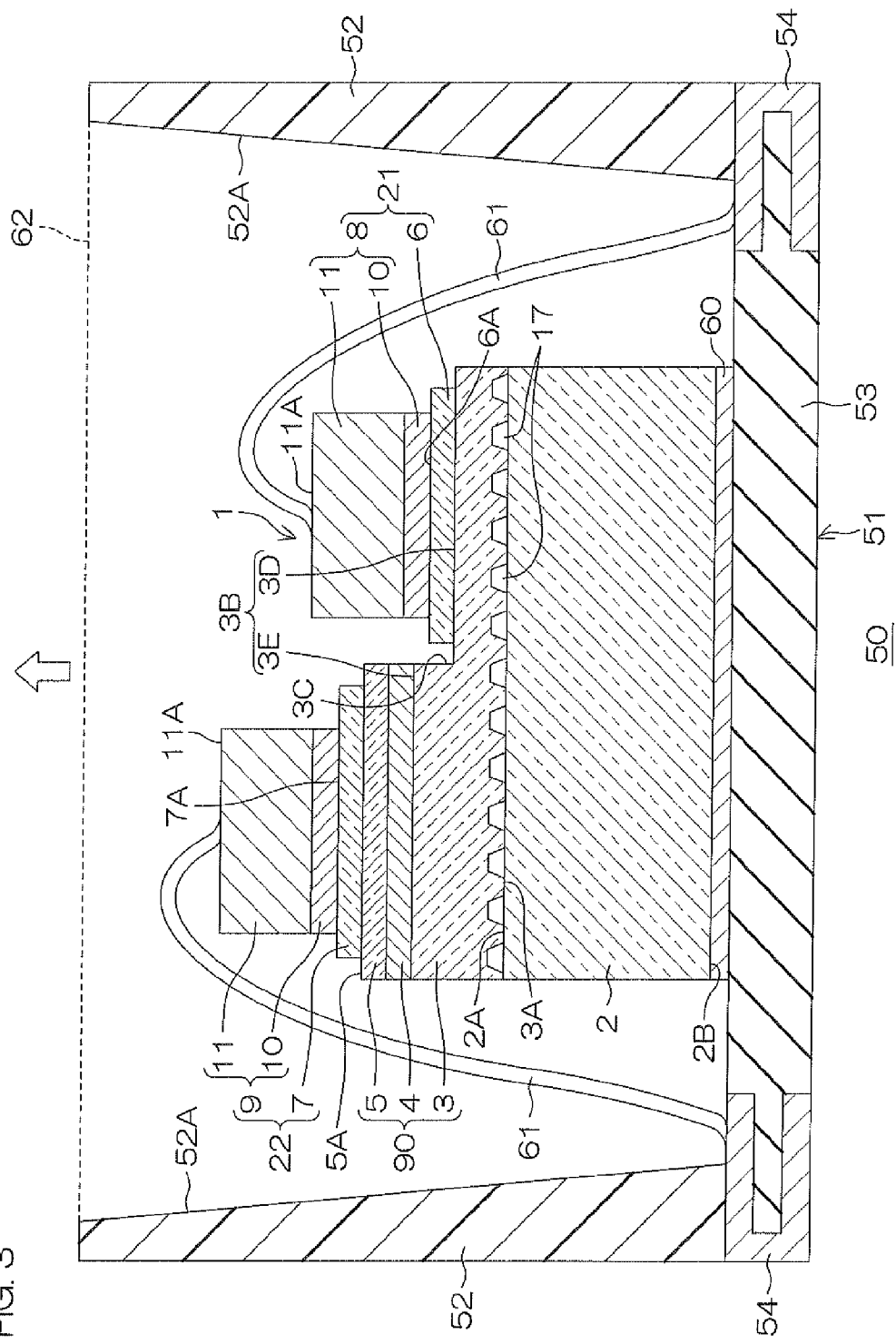
FIG. 3 is a sectional view graphically illustrating the structure of a light emitting device package.

FIG. 3 is a sectional view graphically illustrating the structure of a light emitting device package.

A light emitting device package 50 illustrated in FIG. 3 includes the light emitting device 1 described above, a support substrate 51 and a package 52.

The support substrate 51 has: an insulating substrate 53 made of an insulating material; and a pair of metal leads 54 which are provided to be exposed from both ends of the insulating substrate 53 and electrically connect the light emitting device 1 with the outside. The insulating substrate 53 is formed to have a rectangular planar view, for example, and the leads 54 are respectively formed in a belt-like shape along a pair of opposed sides of the insulating substrate 53. Each lead 54 is formed to extend along a pair of edges of the insulating substrate 53 and folded to extend from an upper surface through a side surface to a lower surface, for example, so as to have a cross section of a U shape turning sideways.

At the light emitting device 1, the rear surface 2B of the substrate 2 is joined with a major surface 51A of the support substrate 51 with a junction layer 60, which is made of paste such as Ag (silver) or solder (Ag in the present preferred embodiment), interposed therebetween. Each of the first electrode 21 and the second electrode 22 of the light emitting device 1 is electrically connected with a nearest lead 54 via a bonding wire 61. Each bonding wire 61 is connected with the surface 11A of the Au layer 11 at each of the first electrode 21 and the second electrode 22.

The package 52 is a ring-shaped case filled with resin and is fixed to the support substrate 51 in a state where the light emitting device 1 is held in (covered with) the case and is surrounded and protected from the sides thereof. In such a state, the first electrode 21 and the second electrode 22, which function as a light extraction side, of the light emitting device 1 are exposed to the outside of the package 52. An inner wall surface of the package 52 forms a reflecting surface 52A for reflecting light emitted from the light emitting device 1 so that the light is extracted to the outside. The reflecting surface 52A of the present preferred embodiment is constituted of an inclined surface, which inclines so as to become closer to the support substrate 51 along an inward direction, and is arranged to reflect light from the light emitting device 1 toward a light extraction direction (the thickness direction of the substrate 2).

In the light emitting device 1 of the light emitting device package 50, electric current flows from the second electrode 22 toward the first electrode 21 when electric power is supplied to each lead 54 so that forward voltage is applied across the first electrode 21 (the first metal layer 8) and the second electrode 22 (the second metal layer 9). Electric current spreads over the whole area of the second ITO layer 7 in the planar view and then flows through the second conductive-type semiconductor layer 5, the light emitting layer 4, the first conductive-type semiconductor layer 3 and the first ITO layer 6 in this order. When electric current flows as described above, electrons are injected from the first conductive-type semiconductor layer 3 to the light emitting layer 4 and holes are injected from the second conductive-type semiconductor layer 5 to the light emitting layer 4. When the holes and the electrons recombine with each other in the light emitting layer 4, blue light having a wavelength within the range of 440 nm to 460 nm is generated. The light is extracted from the surface 5A of the second conductive-type semiconductor layer 5, and the surface 7A of the second ITO layer 7 or the like to the outside of the package 52. In addition, a direction in which light travels toward the outside is indicated by a void arrow in FIG. 3.

In this process, light travelling from the light emitting layer 4 to the first conductive-type semiconductor layer 3 side also exists. The light is transmitted through the first conductive-type semiconductor layer 3 and the substrate 2 in this order. The light is reflected at an interface between the substrate 2 and the junction layer 6, is transmitted through the substrate 2 and the first conductive-type semiconductor layer 3, and is then extracted from the surface 3B (first region 3D) of the first conductive-type semiconductor layer 3, the surface 5A of the second conductive-type semiconductor layer 5, the surface 6A of the first ITO layer 6, the surface 7A of the second ITO layer 7 or the like to the outside. Here, the convex portions 17 formed on the surface 2A of the substrate 2 can suppress total reflection of light, which travels from the substrate 2 toward the first conductive-type semiconductor layer 3 and is incident into the rear surface 3A of the first conductive-type semiconductor layer 3 at various angles, at the rear surface 3A to the substrate 2 side. Moreover, each convex portion 17 can also guide light, which remains in the substrate 2 while diffusely reflecting, to the first conductive-type semiconductor layer 3 side. Thus, the light extraction efficiency is improved.

In addition, sealing resin 62 may be filled inside the ring-shaped package 52. The sealing resin 62 is made of transparent resin (e.g., silicone or epoxy) transparent to an emission wavelength of the light emitting device 1 and seals the light emitting device 1, the bonding wire 61 and the like. Moreover, some resins to be used for constructing the sealing resin 62 may contain a fluorescent material or a reflecting agent. For example, when the light emitting device 1 emits blue light, the light emitting device package 50 can emit white light by causing the resin to contain a yellow fluorescent material.

In addition, a number of light emitting device packages 50 may be used for lighting equipment such as an electric bulb or may be used for a backlight of a liquid crystal television or a headlamp of an automobile or the like.

Figure 4:
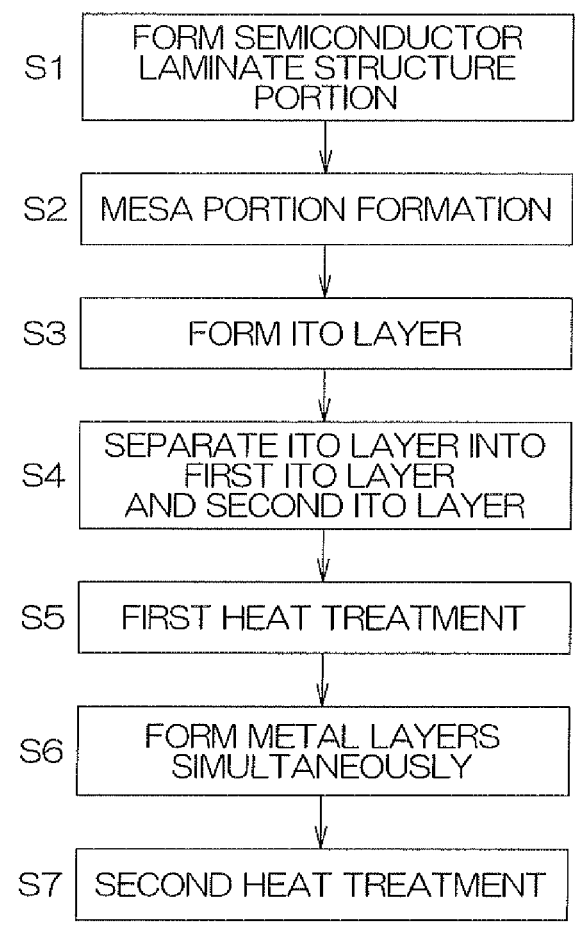
FIG. 4 is a flow chart illustrating a method for manufacturing a light emitting device.

FIG. 4 is a flow chart illustrating a method for manufacturing a light emitting device. FIGS. 5A to 5E are graphical sectional views illustrating a method for manufacturing a light emitting device illustrated in FIG. 2.

Next, referring to FIG. 4 and FIGS. 5A to 5E, a method for manufacturing a light emitting device illustrated in FIG. 2 will be explained.

Figure 5A:
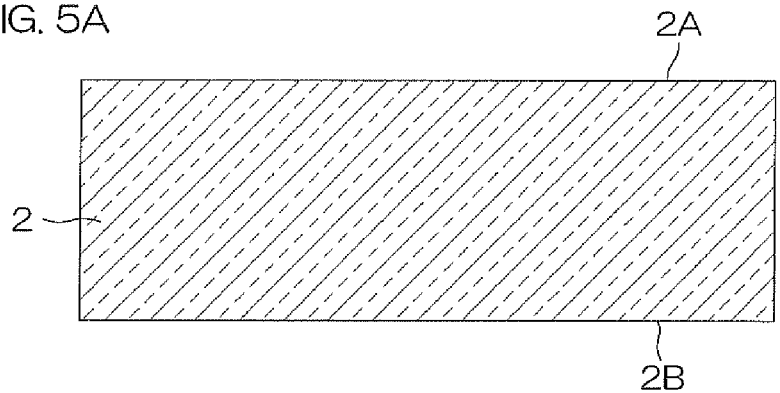
FIG. 5A is a graphical sectional view illustrating a method for manufacturing the light emitting device illustrated in FIG. 2.

First, as illustrated in FIG. 5A, the substrate 2 (strictly speaking, a wafer to become the substrate 2) is prepared.

Figure 5B:
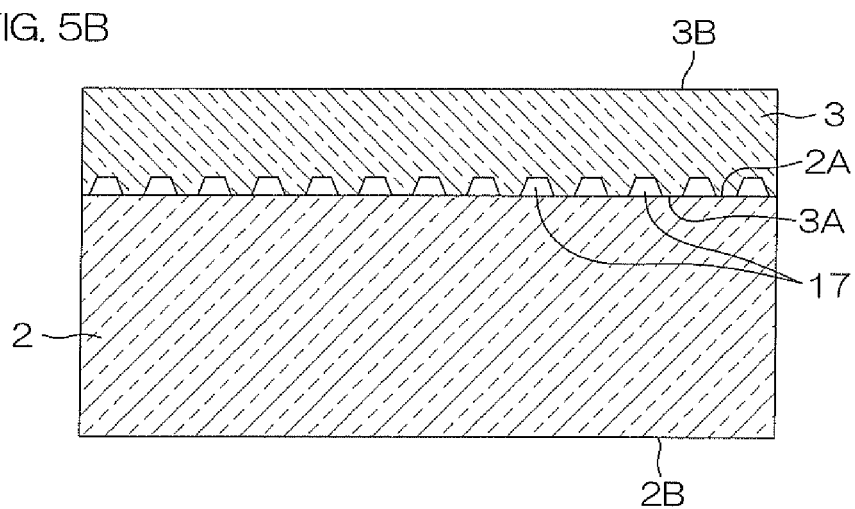
FIG. 5B is a graphical sectional view illustrating a process following FIG. 5A.

Next, a layer (SiN layer) made of SiN is formed at the surface 2A of the substrate 2, and the SiN layer is separated into a plurality of convex portions 17 as illustrated in FIG. 5B by an etching process using a resist pattern (not illustrated) as a mask.

Figure 5C:
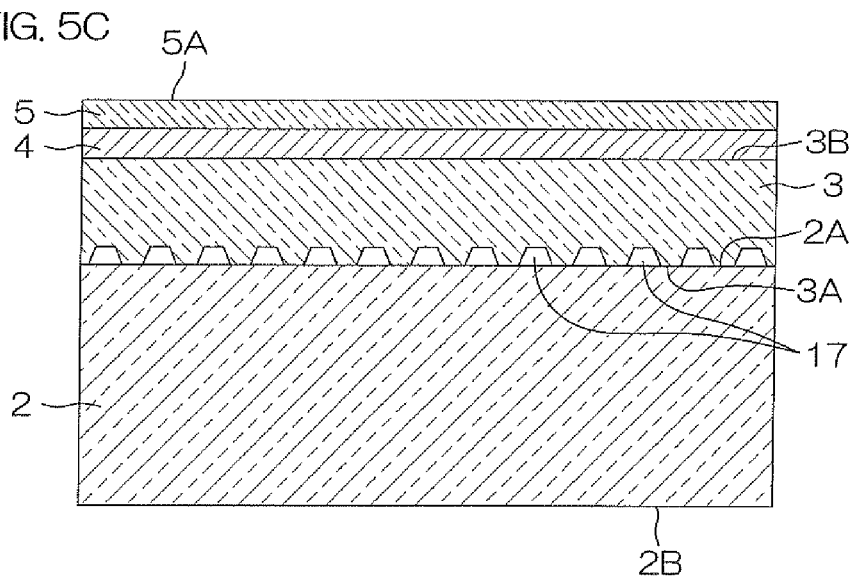
FIG. 5C is a graphical sectional view illustrating a process following FIG. 5B.

Next, the semiconductor laminate structure portion 90 (a laminate of the first conductive-type semiconductor layer 3, the light emitting layer 4 and the second conductive-type semiconductor layer 5) described above is formed on the surface 2A of the substrate 2 (step S1 in FIG. 4). More specifically, a layer (n-GaN layer) made of n-type GaN is formed on the surface 2A of the substrate 2 as illustrated in FIG. 5B. The n-GaN layer is laminated on the substrate 2 as the first conductive-type semiconductor layer 3 and covers all convex portions 17. Next, as illustrated in FIG. 5C, a nitride semiconductor layer (e.g., an $In_xGa_{1-x}N$ layer) including In is formed on the surface 3B of the first conductive-type semiconductor layer 3. The $In_xGa_{1-x}N$ layer becomes the light emitting layer 4 laminated on the first conductive-type semiconductor layer 3. The wavelength of light emitted from the light emitting layer 4 is controlled to fall within the range of 440 nm to 460 nm by adjusting the composition of In and Ga. Next, a layer (p-GaN layer) made of p-type GaN is formed on the light emitting layer 4 as the second conductive-type semiconductor layer 5 as illustrated in FIG. 5C.

Figure 5D:
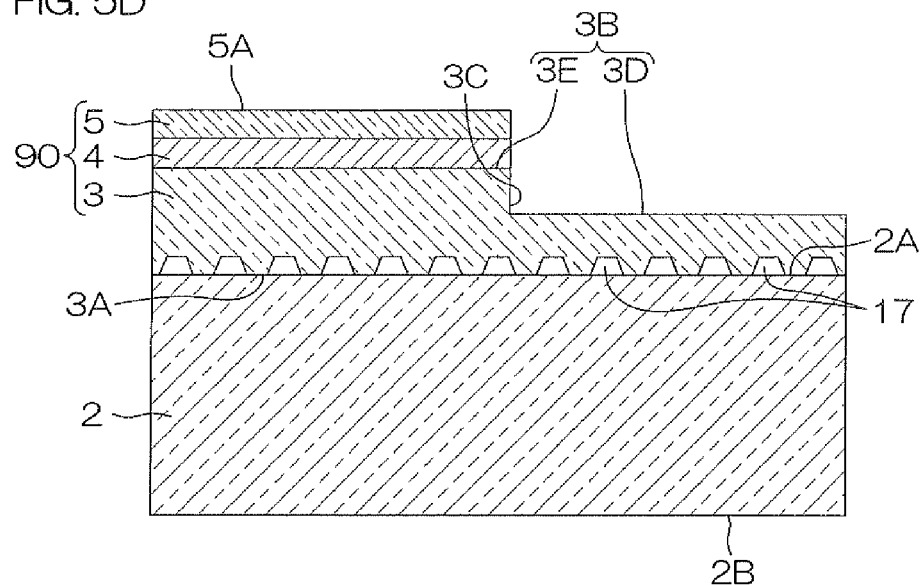
FIG. 5D is a graphical sectional view illustrating a process following FIG. 5C.

Next, a mesa portion (the step 3C to expose the first conductive-type semiconductor layer 3) is formed (step S2 in FIG. 4). More specifically, a part of each of the first conductive-type semiconductor layer 3, the light emitting layer 4 and the second conductive-type semiconductor layer 5 is selectively removed so that the first region 3D of the surface 3B of the first conductive-type semiconductor layer 3 is exposed as illustrated in FIG. 5D by an etching process using a resist pattern (not illustrated) as a mask. When the mesa portion is completed, the semiconductor laminate structure portion 90 is completed.

Next, a layer (ITO layer) made of ITO is formed on the completed semiconductor laminate structure portion 90 (that is, at a side of each of the first conductive-type semiconductor layer 3 and the second conductive-type semiconductor layer 5 opposite to the substrate 2) (step S3 in FIG. 4). The ITO layer covers the first region 3D of the surface 3B of the first conductive-type semiconductor layer 3, the surface 5A of the second conductive-type semiconductor layer 5, and an end surface of each of the first conductive-type semiconductor layer 3, the light emitting layer 4 and the second conductive-type semiconductor layer 5 at the step 3C of the first conductive-type semiconductor layer 3 in a continuous manner.

Figure 5E:
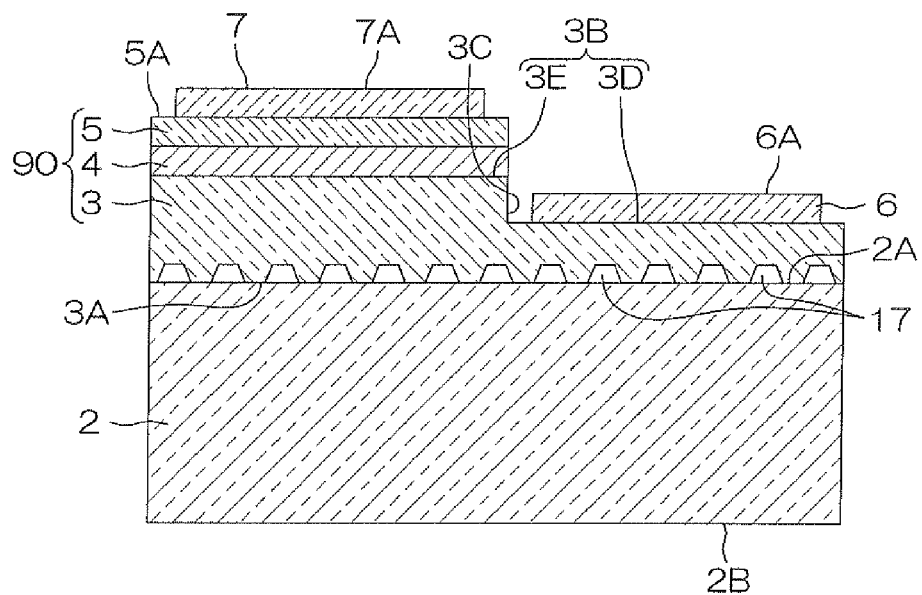
FIG. 5E is a graphical sectional view illustrating a process following FIG. 5D.

Next, the ITO layer is separated into the first ITO layer 6 on the first region 3D of the first conductive-type semiconductor layer 3 and the second ITO layer 7 on the second conductive-type semiconductor layer 5 as illustrated in FIG. 5E by an etch off method, for example (step S4 in FIG. 4).

Figure 6:
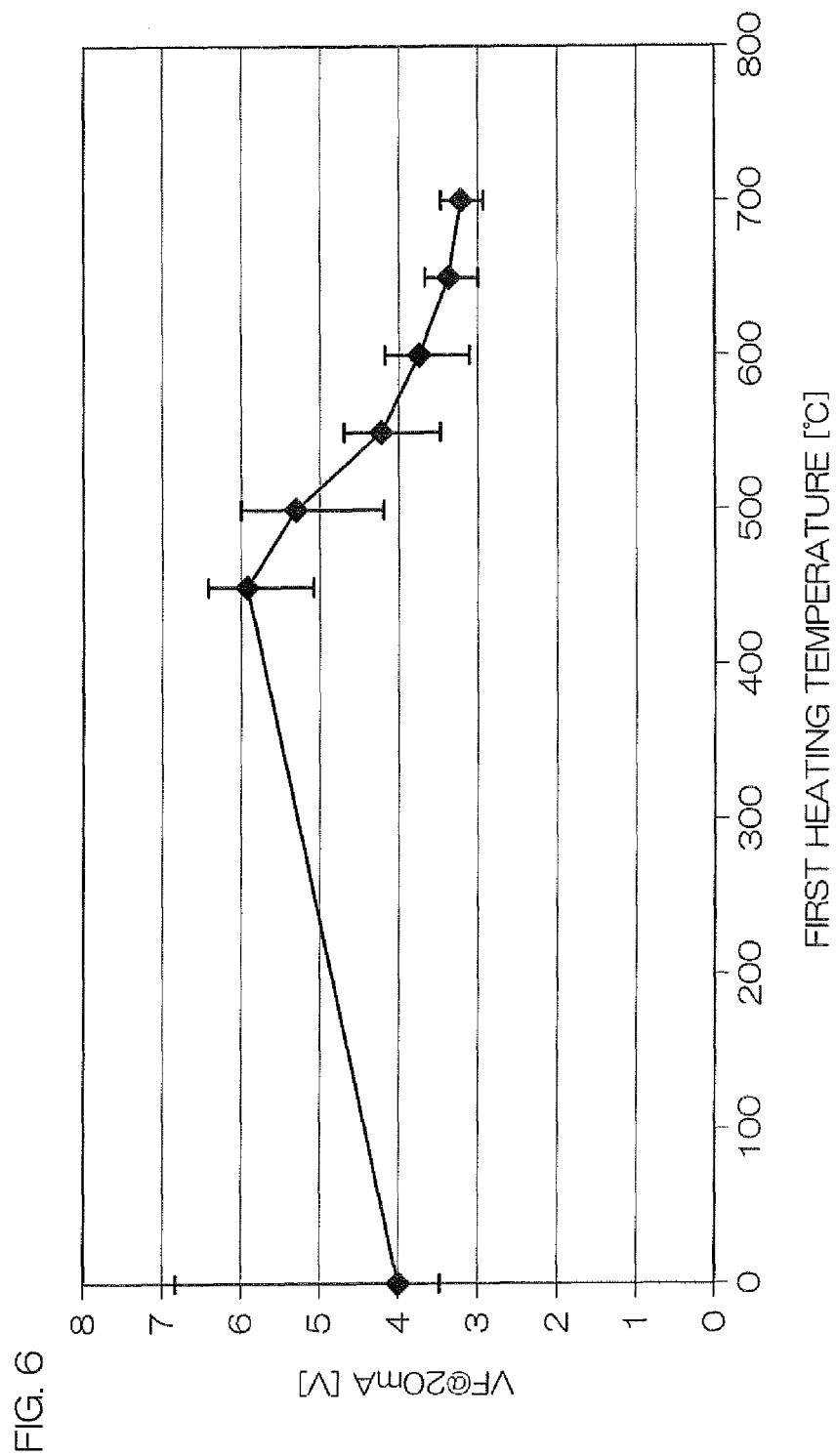
FIG. 6 is a graph illustrating a relationship between a first heating temperature and an electrical characteristic of a light emitting device 1.

Next, first heat treatment is applied at least to the first ITO layer 6 and the second ITO layer 7 with a first heating temperature (within the range of 600° C. to 700° C.; 650° C. here) (step S5 in FIG. 4). In addition, the step S5 may be performed before the step S4. Here, the first heat treatment is applied to the ITO layer (the first ITO layer 6 and the second ITO layer 7 if after separation) after the ITO layer is formed. The first heat treatment makes it possible to improve the ohmic characteristic between the ITO layer (especially the second ITO layer 7) and at least one (especially the p-type second conductive-type semiconductor layer 5) of the first conductive-type semiconductor layer 3 and the second conductive-type semiconductor layer 5. In order to check the improvement of the ohmic characteristic, a plurality of wafers (wafers in which the light emitting device 1 is respectively formed; the same applies hereinafter) were prepared with various first heating temperatures. Light emitting device 1 chips arranged periodically were taken at even intervals from a wafer surface corresponding to each of the various first heating temperatures, electric power was supplied to the respective chips with 20 mA, and a forward voltage (VF) at each chip was measured. Measurement results of VF at the respective light emitting devices 1 corresponding to the respective first heating temperatures are shown in the graph of FIG. 6. In the graph, distribution (range) of VF corresponding to each first heating temperature is shown with the vertical line, and the mean value of VF corresponding to each first heating temperature is shown with a rhomboid dot. It is shown that, as VF becomes lower, a more favorable ohmic characteristic is obtained. The graph shows that VF of a case where a first heating temperature is within the range of 600° C. to 700° C. (equal to or higher than 600° C. and equal to or lower than 700° C.) becomes lower than that of a case where a first heating temperature is lower than 600° C., and the ohmic characteristic is improved.

Next, a layer (Cr layer) made of Cr and a layer (Au layer) made of Au are formed in this order on the semiconductor laminate structure portion 90 by a lift-off method, for example. More specifically, when film formation of a Cr layer and an Au layer is performed and a resist pattern is removed after resist patterning having openings at an upper part of the first ITO layer 6 and the second ITO layer 7, a remaining Cr layer and a remaining Au layer form the first metal layer 8 and the second metal layer 9 simultaneously as illustrated in FIG. 2 (step S6 in FIG. 4). That is, metal layers (the first metal layer 8 and the second metal layer 9) are formed respectively on the first ITO layer 6 and on the second ITO layer 7 simultaneously, and the first electrode 21 and the second electrode 22 are completed simultaneously.

Figure 7:
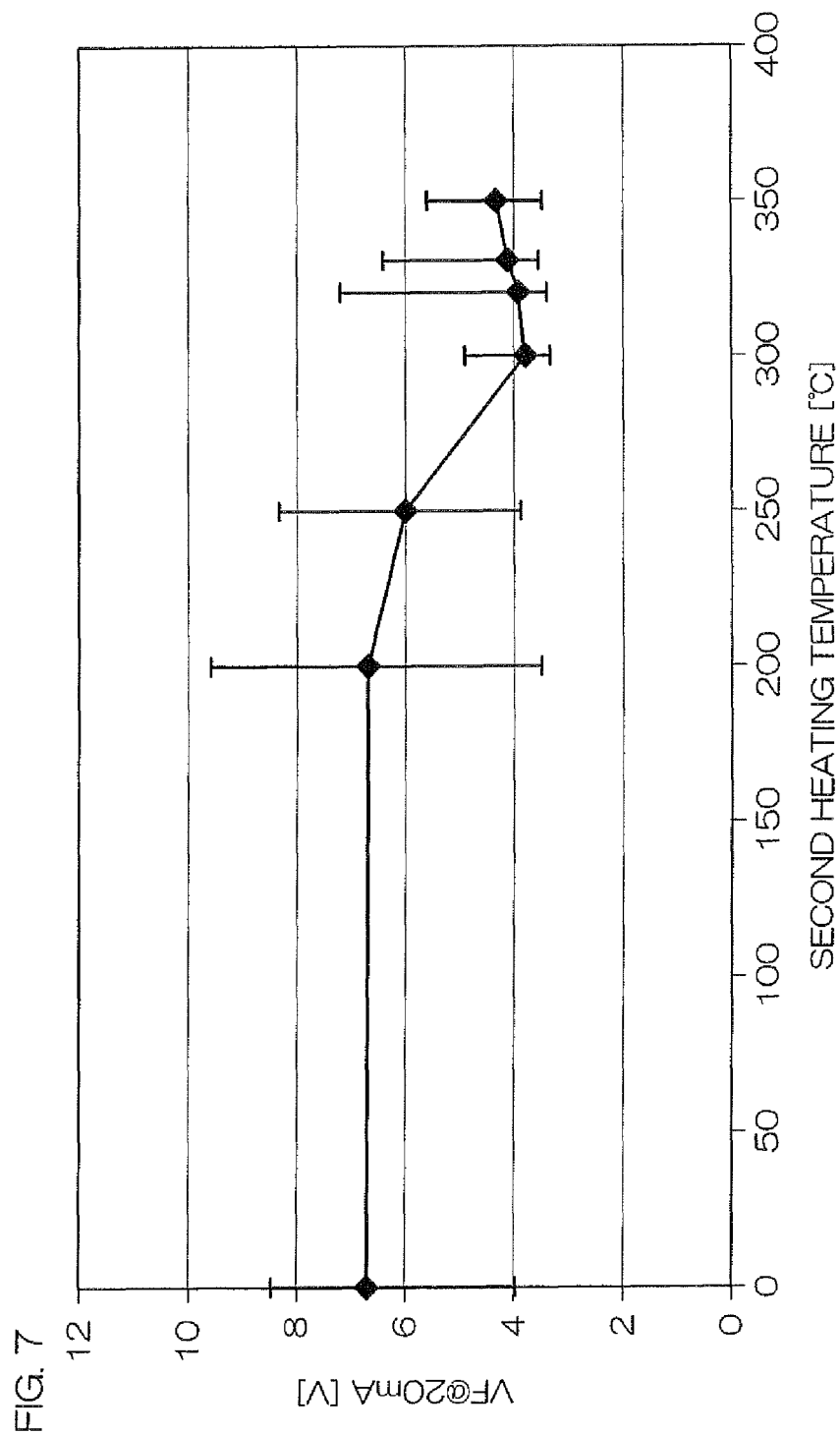
FIG. 7 is a graph illustrating a relationship between a second heating temperature and an electrical characteristic of a light emitting device 1.

Next, second heat treatment is applied to the first electrode 21 (the first ITO layer 6 and the first metal layer 8) and the second electrode 22 (the second ITO layer 7 and the second metal layer 9) with a second heating temperature (within the range of 300° C. to 350° C.; 350° C. here) which is lower than the first heating temperature (step S7 in FIG. 4). The second heat treatment makes it possible to improve the electrical characteristic of the interface between the first ITO layer 6 and the first conductive-type semiconductor layer 3 and therefore makes it possible to improve the ohmic characteristic between the n-type first conductive-type semiconductor layer 3 and the first ITO layer 6. In order to check the improvement of the ohmic characteristic, a plurality of wafers were prepared with various second heating temperatures as is the case with the first heating temperature. Light emitting device 1 chips arranged periodically were taken at even intervals from a wafer surface corresponding to each of the various second heating temperatures, electric power was supplied to the respective chips with 20 mA, and VF at each chip was measured. Measurement results of VF at the respective light emitting devices 1 corresponding to the respective second heating temperatures are shown in the graph of FIG. 7. In the graph, distribution (range) of VF corresponding to each second heating temperature is shown with the vertical line, and the mean value of VF corresponding to each second heating temperature is shown with a rhomboid dot. It is shown that, as VF becomes lower, a more favorable ohmic characteristic is obtained. The graph shows that VF of a case where a second heating temperature is within the range of 300° C. to 350° C. becomes lower than that of a case where a second heating temperature is lower than 300° C. (especially lower than 250° C.), and the ohmic characteristic is improved.

Figure 8:
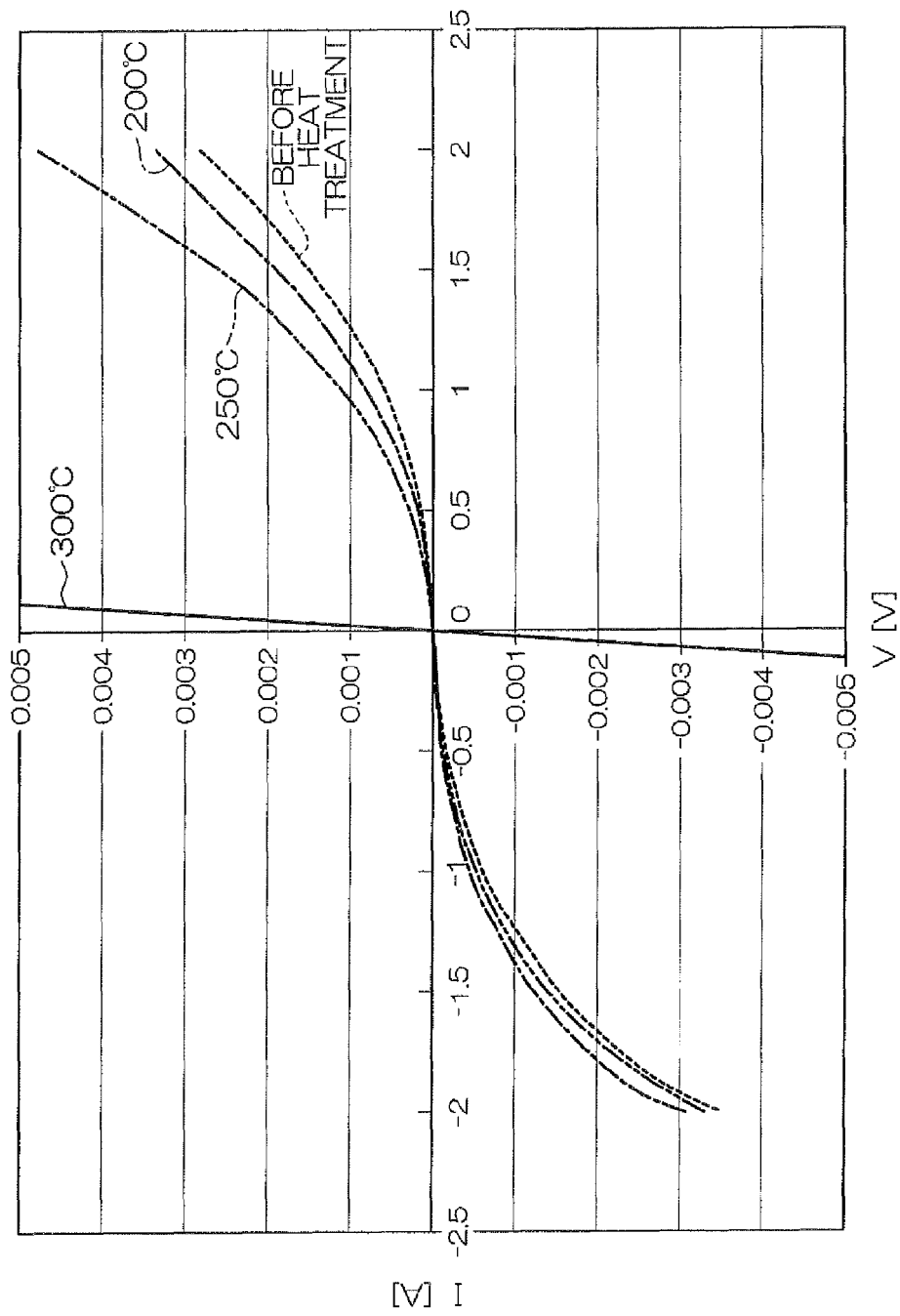
FIG. 8 is a graph illustrating another relationship between a second heating temperature and an electrical characteristic of a light emitting device 1.

Moreover, in order to check improvement of the ohmic characteristic related to a second heating temperature, another evaluation was also made. Regarding the ohmic characteristic related to a second heating temperature, there is a concern that VF increases at the interface between the first electrode 21 and the first conductive-type semiconductor layer 3. Therefore, an electrical characteristic (I-V curve) of a case where electric power is supplied across first electrodes 21 (see FIG. 2) of two adjacent light emitting devices 1 (before separation) on a wafer was measured for each of the various second heating temperatures. The results are shown in FIG. 8. The graph of FIG. 8 shows that the first electrode 21 and the first conductive-type semiconductor layer 3 are in Schottky-contact with each other and the resistance is high in a case before the second heat treatment is performed (see the dotted line), in a case where the second heating temperature is 200° C. (see the one-dot chain line) and in a case where the second heating temperature is 250° C. (see the two-dot chain line). On the other hand, the first electrode 21 and the first conductive-type semiconductor layer 3 are in ohmic-contact with each other and the resistance decreases drastically in a case where the second heating temperature is 300° C. (see the solid line). That is, it is shown that contact of the first electrode 21 with the first conductive-type semiconductor layer 3 changes from Schottky contact to ohmic-contact and the resistance value decreases greatly by performing the second heat treatment with a second heating temperature equal to or higher than 300° C.

In addition, the value of 350° C. (mentioned above) of the second heating temperature is set in consideration of not influencing the adhesion property of the first ITO layer 6 with the first metal layer 8, the adhesion property of the second ITO layer 7 with the second metal layer 9, the adhesion property of the first ITO layer 6 with the first conductive-type semiconductor layer 3, and the adhesion property of the second ITO layer 7 with the second conductive-type semiconductor layer 5. Moreover, the second heat treatment causes mixing of Cr of the Cr layer 10 at the first metal layer 8 into the first ITO layer 6 or mixing of Cr of the Cr layer 10 at the second metal layer 9 into the second ITO layer 7, and therefore the first ITO layer 6 and the second ITO layer 7 include Cr as described above. In addition, whether Cr exists in the first ITO layer 6 or the second ITO layer 7 or not can be determined by an elementary analysis using a TEM (Transmission Electron Microscope).

Although ITO included in the first ITO layer 6 and the second ITO layer 7 originally has an undesirable ohmic characteristic, it is possible to improve the ohmic characteristic dramatically by applying the first heat treatment and the second heat treatment as described above.

With the above processes, the structure illustrated in FIG. 2 is formed. At last, the respective light emitting devices 1 are formed by dicing or cleaving the wafer of the substrate 2 on which the structure of FIG. 2 is formed in a periodic array.

In the case of this light emitting device 1 in which the electrode portions (the first electrode 21 and the second electrode 22) respectively at the first conductive-type semiconductor layer 3 and the second conductive-type semiconductor layer 5 have the same structure in which a metal layer is laminated on an ITO layer, it is possible to form the electrode portions simultaneously (the step S6 described above). Accordingly, it is possible to simplify the manufacturing process of the light emitting device 1.

Moreover, a metal layer (the first metal layer 8 and the second metal layer 9) at each of the first electrode 21 and the second electrode 22 has a Cr layer 10 at the ITO layer side and an Au layer 11 laminated on a Cr layer 10. Accordingly, it is possible to improve the adhesion property of an ITO layer with a metal layer at each of the first electrode 21 and the second electrode 22, and therefore it is possible to prevent a metal layer from peeling off from an ITO layer in the process of bonding a wire (the bonding wire 61 mentioned above) with the metal layer. In order to demonstrate this, a test to intentionally pull the bonding wire 61 after bonding was performed. If the adhesion property of an ITO layer with a metal layer has no problem, the ITO layer does not peel off from the metal layer, and the bonding wire 61 having the lowest strength snaps instead as a result. A plurality (which will be referred to as a preparation number; e.g., approximately 100 to 140) of light emitting device packages 50 (or light emitting devices 1 only bonded with the bonding wire 61) obtained with various second heating temperatures were prepared for each second heating temperature, and the test was performed for each light emitting device package 50. When the ratio (which will be referred to as a pad metal peeling occurrence ratio) of light emitting device packages 50, in which an ITO layer has peeled off from a metal layer in at least one of the first electrode 21 and the second electrode 22, to the preparation number was checked for each second heating temperature, the results shown in FIG. 9 were obtained. FIG. 9 shows that the pad metal peeling occurrence ratio is extremely low, i.e., lower than 1% for a second heating temperature within the range of 300° C. to 500° C. and, furthermore, no pad metal peeling occurs for a second heating temperature within the range of 330° C. to 450° C. In order to achieve both of improvement of the ohmic characteristic and improvement of the adhesion property described above, it is desirable that the second heating temperature is within the range of 300° C. to 350° C. (equal to or higher than 300° C. and equal to or lower than 350° C.).

Moreover, the first heat treatment (the step S5 described above) or the second heat treatment (the step S7 described above) described above makes it possible to improve the adhesion property of the ITO layer respectively with the first conductive-type semiconductor layer 3 and the second conductive-type semiconductor layer 5, and therefore it is also possible to prevent the ITO layer from peeling off respectively from the first conductive-type semiconductor layer 3 and the second conductive-type semiconductor layer 5 in the process of wire bonding.

Thus, it is possible to provide a light emitting device 1 capable of withstanding a manufacturing process (more specifically, a wire bonding process).

In addition, the present invention can be implemented in various forms, and a variety of design changes can be made within the scope of matters described in the claims.

For example, a transparent insulating film (passivation) made of $SiO_2$ or the like may be used for coating the surface 3B (exposed portion) of the first conductive-type semiconductor layer 3, the surface 5A of the second conductive-type semiconductor layer 5, the surface 6A of the first ITO layer 6, and the surface 7A of the second ITO layer 7 for protection. Here, it is preferable that the insulating film is not located (put) on the first metal layer 8 and the second metal layer 9.

For another example, the present invention may have a structure in which a convex portion 17 made of SiN is not formed.

For yet another example, a light emitting device may be arranged to have a first conductive type which is p-type and a second conductive type which is n-type, although the above explanation on a preferred embodiment has explained an example in which the first conductive type is n-type and the second conductive type is p-type. That is, a structure in which p-type and n-type of conductive types in the above preferred embodiment are reversed is also a preferred embodiment of the present invention. Moreover, although GaN is illustrated as a nitride semiconductor for consisting the first conductive-type semiconductor layer 3 and the second conductive-type semiconductor layer 5 in the above preferred embodiment, another nitride semiconductor such as aluminum nitride (AlN) or indium nitride (InN) may also be used. A nitride semiconductor can be generally represented as $Al_xIn_yGa_{1-x-y}N$ ($0 \leq x \leq 1$, $0 \leq x \leq 1$, $0 \leq x+y \leq 1$). Moreover, the present invention may be applied to a light emitting device using not a nitride semiconductor but another compound semiconductor such as GaAs, or a semiconductor material (e.g., diamond) other than a compound semiconductor.

Although preferred embodiments of the present invention have been explained in detail, the preferred embodiments are only specific examples used for clarifying technical contents of the present invention, and therefore the present invention should not be interpreted exclusively as concrete examples, and the spirit and scope of the present invention are limited only by the appended claims.

The present application corresponds to Japanese Patent Application No. 2013-035049 filed with the Japanese Patent Office on Feb. 25, 2013, the entire disclosure of which are hereby incorporated by reference.

What is claimed is:

1. A light emitting device, comprising:
    a substrate;
    a first conductive-type semiconductor layer laminated on the substrate;
    a light emitting layer laminated on the first conductive-type semiconductor layer;
    a second conductive-type semiconductor layer laminated on the light emitting layer;
    a first ITO layer laminated at a side of the first conductive-type semiconductor layer opposite to the substrate and being in direct contact and ohmic-contact with the first conductive-type semiconductor layer;
    a second ITO layer laminated at a side of the second conductive-type semiconductor layer opposite to the substrate and being in direct contact and ohmic-contact with the second conductive-type semiconductor layer;
    a first metal layer laminated on the first ITO layer; and
    a second metal layer laminated on the second ITO layer,
        wherein the first metal layer and the second metal layer have the same structure, and each of the first metal layer and the second metal layer at least includes:

a lower metal layer which contacts with a corresponding ITO layer of the first ITO layer and the second ITO layer; and an upper metal layer laminated on the lower metal layer, the upper metal layer being thicker than the lower metal layer, and wherein the first ITO layer is positioned lower than the light emitting layer in a thickness direction of the substrate, wherein each of the first metal layer and the second metal layer includes: a Cr layer as the lower metal layer laminated on a corresponding ITO layer of the first ITO layer and the second ITO layer; and an Au layer as the upper metal layer laminated on the Cr layer, and wherein each of the first ITO layer and the second ITO layer is thicker than each of the Cr layers and thinner than each of the Au layers.

2. The light emitting device according to claim 1, wherein the first ITO layer and the second ITO layer have the same thickness.

3. The light emitting device according to claim 1, wherein the Cr layers of the first metal layer and the second metal layer have the same thickness and the Au layers of the first metal layer and the second metal layer have the same thickness.

4. The light emitting device according to claim 1, wherein the first ITO layer and the second ITO layer include metal of the lower metal layer.

5. The light emitting device according to claim 4, wherein the first ITO layer and the second ITO layer include Cr.

6. The light emitting device according to claim 1, wherein the first ITO layer is laminated at a region of the first conductive-type semiconductor layer other than a region where the light emitting layer is laminated.

7. A light emitting device package, comprising:
a light emitting device according to claim 1; and
a package for covering the light emitting device.

8. The light emitting device according to claim 1, wherein the thickness of each of the first ITO layer and the second ITO layer is 1000 A to 2000 A.

* * * * *